United States Patent
Gamm et al.

(10) Patent No.: US 12,300,461 B2
(45) Date of Patent: May 13, 2025

(54) PARTICLE BEAM DEVICE, METHOD FOR OPERATING THE PARTICLE BEAM DEVICE AND COMPUTER PROGRAM PRODUCT

(71) Applicant: Carl Zeiss Microscopy GmbH, Jena (DE)

(72) Inventors: Björn Gamm, Koenigsbronn (DE); Erik Essers, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 397 days.

(21) Appl. No.: 17/822,530

(22) Filed: Aug. 26, 2022

(65) Prior Publication Data
US 2023/0065373 A1 Mar. 2, 2023

(30) Foreign Application Priority Data
Aug. 30, 2021 (DE) .......................... 102021122390.3

(51) Int. Cl.
*H01J 37/28* (2006.01)
*H01J 37/10* (2006.01)
*H01J 37/244* (2006.01)

(52) U.S. Cl.
CPC .............. *H01J 37/28* (2013.01); *H01J 37/10* (2013.01); *H01J 37/244* (2013.01)

(58) Field of Classification Search
CPC .. H01J 37/00; H01J 37/02; H01J 37/26; H01J 37/28; H01J 37/10; H01J 37/244;
(Continued)

(56) References Cited

U.S. PATENT DOCUMENTS

| 4,675,524 A | * | 6/1987 | Frosien | H01J 37/153 |
| | | | | 250/311 |
| 5,424,541 A | * | 6/1995 | Todokoro | H01J 37/28 |
| | | | | 250/307 |

(Continued)

FOREIGN PATENT DOCUMENTS

DE 693 27 355 T2 8/2000

OTHER PUBLICATIONS

E. Plies et al., "Experimental results using a "low-voltage booster" in a conventional SEM", Nuclear Instruments and Methods in Physics Research Section A 427, 1999, pp. 126-130.

(Continued)

*Primary Examiner* — Jason L McCormack
(74) *Attorney, Agent, or Firm* — Fish & Richardson P.C.

(57) ABSTRACT

A particle beam device has a particle source, an extraction stop, an anode stop and a beam tube. A driver system of the particle beam device is configured to apply an electrical excitation stop potential to the extraction stop, to apply an electrical anode stop potential, able to be set in a variable manner, to the anode stop and to apply an electrical beam tube potential to the beam tube. A controller of the particle beam device is configured to control the driver system such that a voltage between the extraction stop and the anode stop is able to be set in a variable manner, as a result of which a current strength of the particle beam passing through the aperture of the anode stop is able to be set in a variable manner.

24 Claims, 4 Drawing Sheets

(58) Field of Classification Search
CPC .... H01J 37/06; H01J 3/029; H01J 2237/0268; H01J 2237/0451; H01J 2237/0653; H01J 2237/188
USPC .............................. 250/306, 307, 311, 396 R
See application file for complete search history.

(56) References Cited

U.S. PATENT DOCUMENTS

| | | | |
|---|---|---|---|
| 5,483,073 | A | 1/1996 | Benner |
| 6,194,729 | B1 * | 2/2001 | Weimer .................. H01J 37/28 850/8 |
| 6,407,387 | B1 * | 6/2002 | Frosien .................. H01J 37/28 250/397 |
| 7,339,167 | B2 * | 3/2008 | Ohshima ................. H01J 37/28 250/306 |
| 2014/0077077 | A1 | 3/2014 | Jiang et al. |
| 2016/0035534 | A1 * | 2/2016 | Biberger ................. H01J 37/20 250/307 |
| 2018/0330912 | A1 | 11/2018 | Drexel et al. |
| 2020/0211810 | A1 | 7/2020 | Zeidler |
| 2021/0319977 | A1 * | 10/2021 | Liu ..................... H01J 37/1474 |
| 2023/0065039 | A1 | 3/2023 | Essers et al. |

OTHER PUBLICATIONS

German Office Action, with translation thereof, for corresponding DE application No. 10 2021 122 390.3 dated Jun. 7, 2022.

\* cited by examiner

PARTICLE BEAM DEVICE, METHOD FOR OPERATING THE PARTICLE BEAM DEVICE AND COMPUTER PROGRAM PRODUCT

CROSS-REFERENCE TO RELATED APPLICATION

This application claims benefit under 35 U.S.C. § 119 to German Application No. 10 2021 122 390.3, filed Aug. 30, 2021. The contents of this application is hereby incorporated by reference in its entirety.

FIELD

The present disclosure relates to a particle beam device, that is to say a device that generates a beam of charged particles (particle beam), to a method for operating the particle beam device and to a computer program product that enables a computer to carry out the method. The charged particles of the particle beam can be electrons or ions. The particle beam device is for example a microscope, such as a scanning electron microscope. The disclosure relates for example to maximizing the current strength of the particle beam that is able to be supplied to a sample.

BACKGROUND

In particle beam devices, it can be desirable to set the current strength of the particle beam to a high value. In addition to the maximum possible current strength of the particle beam that is able to be directed onto the sample, the dynamic range of the current strength of the particle beam is also a performance feature. The dynamic range denotes the range of values within which the current strength of the particle beam is able to be varied, and the number of setting options within the range of values. Some applications of a particle beam device use a high current strength of the particle beam; other applications use a low current strength of the particle beam.

SUMMARY

The present disclosure seeks to provide a particle beam device and a method for operating the particle beam device suitable for generating a particle beam having a high maximum current strength and having a high dynamic range for the current strength of the particle beam.

A first aspect of the disclosure relates to a particle beam device, comprising: a particle source for providing charged particles; an extraction stop having an aperture; a driver system that is configured to apply an electrical extraction stop potential $\phi$Ext to the extraction stop, thereby forming, from the charged particles, a particle beam that passes through the aperture of the extraction stop; an anode stop that is arranged downstream of the extraction stop and has an aperture onto which the particle beam is directed during operation; wherein the driver system is furthermore configured to apply an electrical anode stop potential $\varphi$A, able to be set in a variable manner and different from the extraction stop potential $\varphi$Ext, to the anode stop; a beam tube that is arranged downstream of the anode stop and has an entrance aperture through which the particle beam enters the beam tube during operation; wherein the driver system is furthermore configured to apply an electrical beam tube potential $\varphi$L, which is different from the anode stop potential $\varphi$A, to the beam tube; a controller that is configured to control the driver system such that a voltage between the extraction stop and the anode stop is able to be set in a variable manner; wherein the aperture of the extraction stop and the aperture of the anode stop are matched to one another such that a current strength of the particle beam passing through the aperture of the anode stop is able to be set in a variable manner by changing the voltage between the extraction stop and the anode stop.

The particle source is for example a cathode that provides bound electrons. The extraction stop is used for example to separate the electrons bound in the cathode in the course of the field emission and thereby to generate free electrons. For this purpose, the extraction stop potential $\varphi$Ext can be applied to the extraction stop, this extraction stop potential being different from a particle source potential $\varphi$HT that is applied to the particle source (cathode). As a result, an electric field that can be strong enough to separate the electrons bound in the cathode from the cathode is generated between the cathode and the extraction stop. Specific examples of setting the extraction stop potential $\varphi$Ext are given further below. The particle beam (electron beam) can be formed from the free electrons.

However, the particle source may also be an ion source that provides ions.

The extraction stop can have an opening, which is referred to as an aperture. The aperture is defined and delimited by the extraction stop. The extraction stop may be for example a metal plate. During operation, charged particles can pass through the aperture of the extraction stop, thereby forming the particle beam.

In the present description, "a first object is arranged upstream of a second object" and "a second object is arranged downstream of a first object" each mean that the first object is arranged ahead of the second object along the direction of propagation of the particle beam. The particle beam accordingly reaches the position of the first object first, and then the position of the second object. The term "upstream" may also mean "counter to the direction of propagation of the particle beam". The term "downstream" may also mean "along the direction of propagation of the particle beam".

The anode stop can be arranged downstream of the extraction stop. This means that the particles provided by the particle source pass through the extraction stop first and then impinge on the anode stop or pass through the aperture of the anode stop. The particles of the particle beam that impinge on the anode stop itself can be blocked by the anode stop and are not able to pass through the anode stop. The particles of the particle beam that are directed onto the aperture of the anode stop are not blocked by the anode stop and are able to pass through the anode stop through the aperture.

The driver system makes it possible to apply different electrical potentials, able to be set in a variable manner, to the extraction stop and the anode stop. This makes it possible to generate a variable electric field, which acts on the particle beam, between the extraction stop and the anode stop. The electric field (for example due to a geometry of the extraction stop and of the anode stop in which these are oriented substantially parallel to one another) acts for example substantially parallel to a central axis of the particle beam device. The direction and the strength of the electric field is able to be set in a variable manner as a function of the voltage between the extraction stop and the anode stop, this voltage being defined by the extraction stop potential $\varphi$Ext and the anode stop potential $\varphi$A and being able to be set in a variable manner by the controller by controlling the driver system. This means that the strength of the electric field is able to be set to a large number of different values in a targeted manner through a control signal from the controller.

The particles of the particle beam may therefore be accelerated or braked, specifically each to different extents, as a function of the voltage between the extraction stop and the anode stop, that is to say as a function of the voltage between the extraction stop potential φExt and the anode stop potential φA.

The divergence angle of the particle beam also can change as a result of the acceleration or braking of the particles of the particle beam between the extraction stop and the anode stop. The location-dependent number of particles that pass through the aperture of the anode stop per unit of time and per unit of area (that is to say the local current strength in the aperture of the anode stop) can therefore also change. The current strength that is able to pass through the aperture of the anode stop, and thus the maximum current strength that is able to be directed onto a sample, may thus be set via the voltage between the extraction stop and the anode stop.

According to some embodiments, the aperture of the extraction stop and the aperture of the anode stop are for this purpose matched to one another such that a ratio of particles of the particle beam that pass through the aperture of the anode stop to particles of the particle beam that are blocked by the anode stop is able to be set in a variable manner by changing the voltage between the extraction stop and the anode stop. The ratio is defined by a dividend and a divisor. The dividend represents that portion of the particles of the particle beam that is not blocked by the anode stop and passes through the aperture of the anode stop. The divisor represents that portion of the particles of the particle beam that is blocked by the anode stop and does not pass through the aperture of the anode stop. The anode stop accordingly can limit the current strength of the particle beam passing through the anode stop, through the aperture of the anode stop, by blocking a portion (which is able to be set in a variable manner) of the particle beam.

By way of example, the controller comprises an operating mode (that is to say the controller may be operated in an operating mode) in which the driver system is controlled (that is to say the controller controls the driver system) such that the voltage between the extraction stop and the anode stop has a first voltage value. The current strength of the particle beam that passes through the anode stop, through the aperture of the anode stop, can accordingly be limited to a first value.

By way of example, the controller comprises a further operating mode (that is to say the controller may be operated in a further operating mode) in which the driver system is controlled such that the voltage between the extraction stop and the anode stop has a second voltage value that is different from the first voltage value. The current strength of the particle beam that passes through the anode stop, through the aperture of the anode stop, can accordingly be limited to a second value that is different from the first value.

According to some embodiments, the controller is configured to control the driver system such that the absolute value of the voltage between the extraction stop and the anode stop (that is to say |φExt−φA|) is at least 1 kV.

When the electrical potentials that are set at the extraction stop and the anode stop by the controller by controlling the driver system are the same, no electric field (or an electric field with a field strength of zero) is generated between the extraction stop and the anode stop. The charged particles of the particle beam are accordingly not additionally accelerated or braked.

The extraction stop and the anode stop are for example arranged so as to be directly adjacent along the central axis. No further stops to which it is possible to apply an electrical potential that is controlled in a targeted manner are accordingly arranged between the extraction stop and the anode stop.

The driver system makes it possible to apply different electrical potentials, able to be set in a variable manner, to the anode stop and the beam tube. This makes it possible to generate an electric field, which acts on the particle beam, between the anode stop and the beam tube. The electric field (for example due to a geometry of the anode stop and of the beam tube) acts for example substantially parallel to the central axis of the particle beam device. The direction and the strength of the electric field is able to be set in a variable manner as a function of the voltage between the anode stop and the beam tube, this voltage being defined by the anode stop potential φA and the beam tube potential φL and being able to be set in a variable manner by the controller by controlling the driver system. This means that the strength of the electric field is able to be set to a large number of different values in a targeted manner through a control signal from the controller.

According to some embodiments, the driver system is furthermore configured to set the beam tube potential φL in a variable manner. This can provide a further degree of freedom for controlling the particle beam, and the electric field between the anode stop and the beam tube is able to be changed by changing the beam tube potential φL.

According to some embodiments, the controller is configured, by controlling the driver system, to generate the anode stop potential φA and the beam tube potential φL such that the particles of the particle beam are braked between the anode stop and the beam tube.

According to some embodiments, the controller is configured, by controlling the driver system, to generate the anode stop potential φA and the beam tube potential φL such that the particles of the particle beam are accelerated between the anode stop and the beam tube.

According to some embodiments, the extraction stop, the anode stop and the beam tube are each electrically isolated from one another so that different electrical potentials are able to be applied to the extraction stop, the anode stop and the beam tube.

According to some embodiments, the controller is configured to control the driver system such that an absolute value of a voltage between the anode stop and the beam tube (that is to say |φA−φL|) is at least 1 kV.

The anode stop and the beam tube are for example arranged so as to be directly adjacent along the central axis. No further stops to which it is possible to apply an electrical potential that is controlled in a targeted manner are accordingly arranged between the anode stop and the beam tube.

According to some embodiments, the extraction stop and the anode stop are at a distance other than zero, and less than 4 mm, from one another. In one configuration, the distance is for example 2 mm. As an alternative, the distance may be greater than 4 mm, for example 7 mm.

According to some embodiments, the aperture of the extraction stop and the entrance aperture of the beam tube are at a distance from one another that is at least 5 mm and/or that is at most 20 mm, such as at most 14 mm, for example at most 10 mm. This means that a relatively small installation space is available for the structural implementation of the extraction stop, the anode stop and the entrance aperture of the beam tube. It is thereby possible to easily implement the present disclosure in pre-existing structures. The further structure of the particle beam device therefore does not have to be adapted significantly with respect to the existing structures.

According to some embodiments, the particle beam device furthermore comprises: a terminating stop that is arranged downstream of the beam tube and has an aperture through which the particle beam passes during operation; wherein the driver system is furthermore configured to apply an electrical terminating stop potential φT to the terminating stop; wherein the driver system is configured to generate the beam tube potential φL and the terminating stop potential φT such that a voltage between the beam tube and the terminating stop is able to be set to different values as a function of a signal from the controller. It is thereby possible to set an energy of the particles of the particle beam before they impinge on a sample (that is to say the landing energy).

The terminating stop may for example be electrically isolated from the beam tube. The terminating stop may be the last component of the particle beam device along the central axis before the particle beam impinges on a sample. The terminating stop may therefore be the last stop through which the particle beam passes before it impinges on the sample.

According to some embodiments, the controller is configured, by controlling the driver system, to generate the beam tube potential φL and the terminating stop potential φT such that the particles of the particle beam are braked between the beam tube and the terminating stop.

According to some embodiments, the particle beam device furthermore comprises: a sample holder on which a sample is able to be positioned; wherein the driver system is furthermore configured to apply an electrical sample potential to the sample or the sample holder; wherein the driver system is configured to generate the terminating stop potential φT and the sample potential φS such that a voltage between the terminating stop and the sample or between the terminating stop and the sample holder is able to be set to different values as a function of a signal from the controller. It is thereby possible to set an energy of the particles of the particle beam before they impinge on the sample (that is to say the landing energy).

According to some embodiments, the driver system is furthermore configured to apply an electrical particle source potential φHT to the particle source.

A few specific examples of the ranges of electrical potentials and voltages of the individual components of the particle beam device, within which ranges the potentials and voltages are able to be set, are given below.

The particle source potential φHT applied to the particle source is able to be set in the range from −30 kV to −100 V with respect to ground (0 V).

The voltage between the extraction stop and the particle source, that is to say the difference φExt−φHT between the extraction stop potential φExt and the particle source potential φHT, may be able to be set in the range from 0.5 kV to 7 kV. It is accordingly the case that: φExt=φHT+(0.5 kV to 7 kV), that is to say the extraction stop potential yExt is able to be set in the range from φHT+0.5 kV) to φHT+7 kV).

The anode stop potential φA applied to the anode stop is able to be set in the range from −kV to +15 kV with respect to ground (0 V).

The beam tube potential φL applied to the beam tube is able to be set in the range from 0 kV to 10 kV with respect to ground (0 V).

The terminating stop potential φT applied to the terminating stop is able to be set in the range from −1 kV to +1 kV, such as in the range from −5 kV to +5 kV, with respect to ground (0 V). The difference between the beam tube potential φL and the terminating stop potential φT is set for example to a value in the range from 0 kV to 10 kV, such as 0 kV to 15 kV.

The sample potential φS applied to the sample or the sample holder is able to be set in the range from −1 kV to +1 kV, such as in the range from −5 kV to +5 kV, with respect to ground (0 V). The difference between the terminating stop potential φT and the sample potential φS is set for example to a value in the range from 0 kV to +5 kV, such as −5 kV to +5 kV.

The above values apply for example to a case in which a distance between the extraction stop and the anode stop is relatively large (for example greater than 4 mm, such as around 7 mm).

When a distance between the extraction stop and the anode stop is small (for example smaller than 4 mm, such as around 2 mm), in a departure from the above configuration, the anode stop potential φA may be operated in the range from φExt+1 kV) to φExt+10 kV), such as φExt−3 kV) to φExt+15 kV).

According to some embodiments, the controller is furthermore configured to change the voltage between the extraction stop and the anode stop and in the process to keep a voltage between the extraction stop potential φExt and the particle source potential φHT substantially constant in order to keep the electric field strength at the emission peak of the particle source substantially constant. In order to keep the electric field strength at the emission peak of the particle source as constant as possible upon a change in the voltage between the extraction stop and the anode stop, provision may however also be made for the voltage between the extraction stop potential φExt and the particle source potential φHT to be changed slightly. In this case, the change in the voltage between the extraction stop potential φExt and the particle source potential φHT is (very much) smaller than the change in the voltage between the extraction stop and the anode stop. By way of example, the change in the voltage between the extraction stop potential φExt and the particle source potential φHT is smaller by a factor of at least 50 (optionally at least 200) than the change in the voltage between the extraction stop and the anode stop.

According to some embodiments, the controller is furthermore configured to change the voltage between the extraction stop and the anode stop and in the process to keep a voltage between the particle source and the sample or between the particle source and the sample holder constant.

The values indicated herein for electrical potentials and voltages refer to a particle beam of negatively charged particles (electrons). The values apply with reversed polarity in the case of a particle beam comprising positively charged particles (ions).

The range specifications indicated herein for electrical potentials indicate the range within which the respective electrical potentials are able to be set. In other words, the driver system is configured to generate defined electrical potentials that cover the respective ranges, and the controller is configured to instruct the driver system to generate the corresponding electrical potentials.

According to some embodiments, the particle beam device furthermore comprises a multi-aperture stop that is arranged in the beam tube downstream of the entrance aperture of the beam tube and has a plurality of adjacently arranged apertures of different size; and a deflection system that is configured to selectively deflect the particle beam onto one of the apertures of the multi-aperture stop. The controller is configured to drive the deflection system so as thereby to deflect the particle beam.

According to some embodiments, the multi-aperture stop is a pressure stage stop by way of which a vacuum region located upstream of the multi-aperture stop and a vacuum region located downstream of the multi-aperture stop are separated from one another. The two vacuum regions maintain different vacuums and are spatially separated from one another by the pressure stage stop. The vacuum region located upstream of the multi-aperture stop is in this case an ultra-high vacuum region of the beam generator.

According to some embodiments, the particle beam device has a first vacuum region in which the particle source and the extraction stop are arranged, and has a second vacuum region in which the entrance aperture of the beam tube is arranged. During operation, the first and the second vacuum region maintain different vacuums.

According to some embodiments, the anode stop is arranged at an interface between the first vacuum region and the second vacuum region. The anode stop serves here as a pressure stage stop. The different vacuums generate a pressure that acts on the pressure stage stop. The pressure stage stop is however designed to withstand the pressure.

According to some embodiments, the particle beam device furthermore comprises an objective lens that is arranged downstream of the entrance aperture of the beam tube (and downstream of the multi-aperture stop) and is configured to focus the particle beam (onto a sample).

A second aspect of the disclosure relates to a method for controlling the particle beam device. The method comprises changing the voltage between the extraction stop and the anode stop in a controlled manner, as a result of which the current strength of the particle beam passing through the aperture of the anode stop is changed. The change is not arbitrary, but rather controlled. By way of example, the controlled change is implemented by a program that is executed by a processor of the controller. The program may indicate the change through an operating parameter that is read and processed by the controller, that is to say the controller controls the driver system based on the operating parameter that represents the change in the voltage between the extraction stop and the anode stop.

A third aspect of the disclosure relates to a computer program product that contains computer-readable instructions that, when executed on a computer, prompt the computer to carry out one of the methods described herein. The computer program product may for example be a data carrier on which the computer-readable instructions are recorded. The computer program product may however also be a signal that is stored in a data memory and is able to be transmitted from one computer to another computer through data communication.

BRIEF DESCRIPTION OF THE DRAWINGS

Embodiments of the disclosure are explained in more detail below with reference to figures, in which.

DETAILED DESCRIPTION

Figure 1:
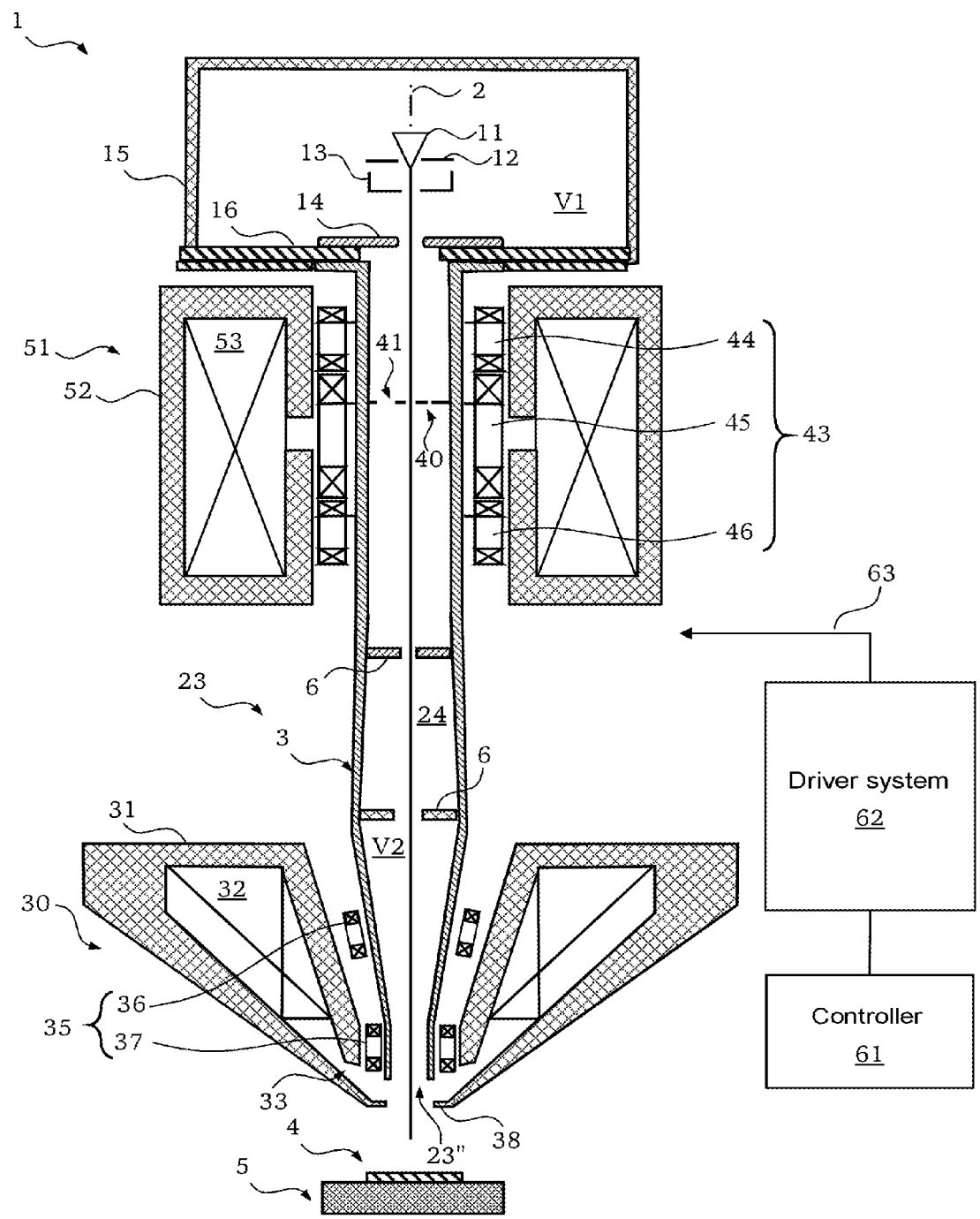
FIG. 1 shows a schematic illustration of a particle beam device.

FIG. 1 shows a schematic illustration of a particle beam device 1. In the example shown, the particle beam device 1 is a scanning electron microscope. The particle beam device 1 may however also be an ion beam column, for example a focused ion beam system (FIB system). The particle beam device 1 may be part of a particle beam system that may have multiple such particle beam devices having a common working region.

The particle beam device 1 comprises a particle source 11 that is configured to provide charged particles. An electrical potential may be applied to the particle source, this electrical potential being referred to herein as particle source potential $\varphi HT$ (see FIG. 2).

The particle beam device 1 furthermore comprises a suppression electrode 12 that is configured to prevent particles thermally emitted by the particle source 11 from moving downstream (that is to say in the direction of a sample 4) along a central axis 2. The suppression electrode 12 blocks for example particles that are not emitted at an emission peak of the particle source 11, but rather further above the emission peak. This is achieved by applying, to the suppression electrode 12, an electrical potential $\varphi Sup$ that differs from the particle source potential $\varphi HT$ in a manner so as to generate, between the particle source 11 and the suppression electrode 12, an electric field that largely prevents the particles emitted by the particle source 11 upstream of the suppression electrode 12 from contributing to the particle beam 3, which is described later on. The strength of the electric field may be set such that only thermally emitted particles are blocked.

The particle beam device 1 furthermore comprises an extraction stop 13 that is arranged downstream of the particle source 11. An electrical potential may be applied to the extraction stop 13, this electrical potential being referred to herein as extraction stop potential $\varphi Ext$ (see FIG. 2). The extraction stop potential $\varphi Ext$ and the particle source potential $\varphi HT$ are generated such that the resulting voltage between the extraction stop potential $\varphi Ext$ and the particle source potential $\varphi HT$ generates an electric field between the particle source 11 and the extraction stop 13, this electric field extracting charged particles from the particle source 11 (what is known as field emission).

The extraction stop 13 has an aperture 13' (see FIG. 2), through which the charged particles extracted from the particle source 11 pass. These particles form the particle beam 3, which is manipulated downstream by the further components of the particle beam device 1.

Figure 2:
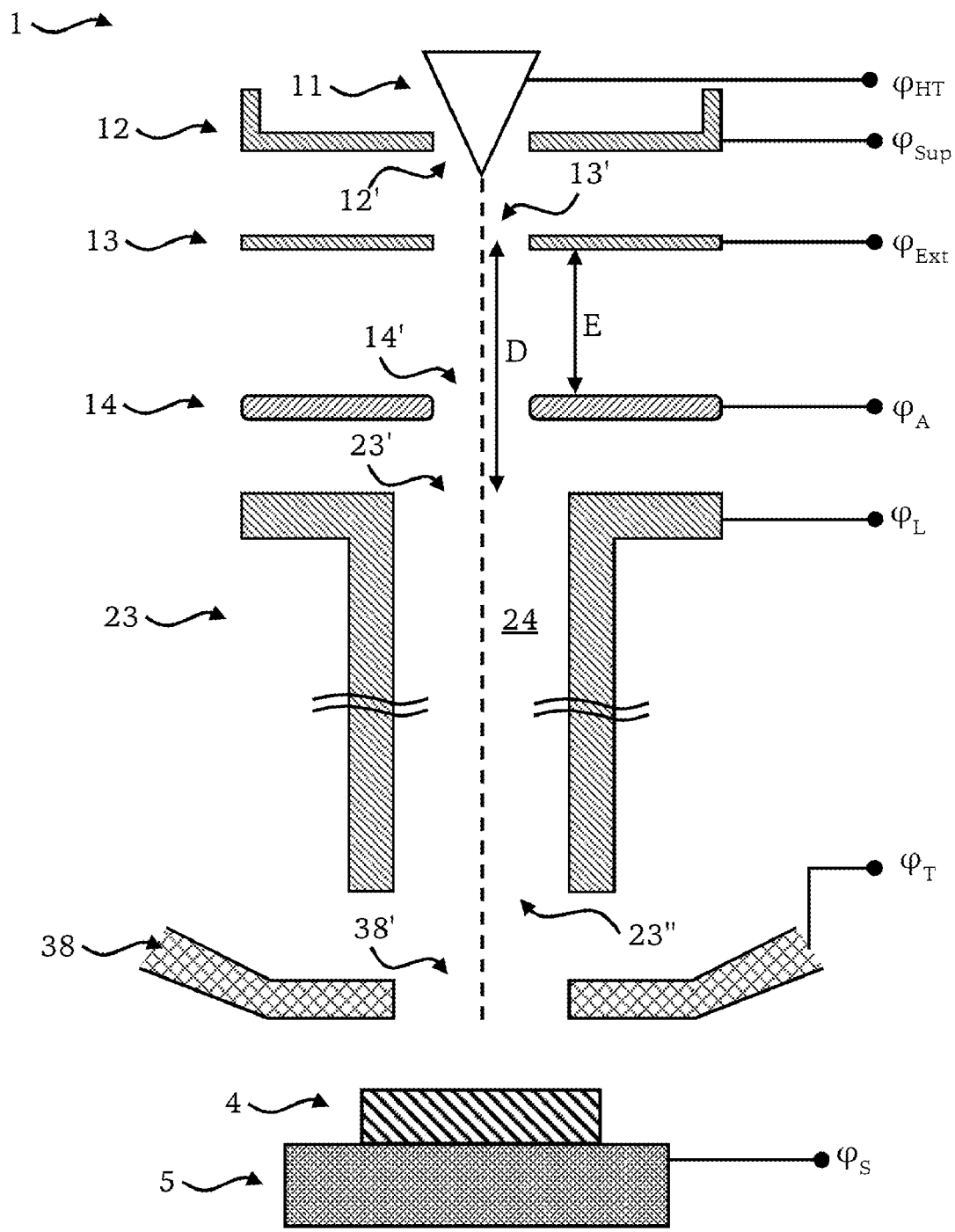
FIG. 2 shows a schematic illustration of individual components of the particle beam device and the electrical potentials applied thereto.

Downstream of the extraction stop 13 is arranged an anode stop 14 having an aperture 14' (see FIG. 2). During operation, the particle beam 3 is directed onto the aperture 14' of the anode stop 14. An electrical potential may be applied to the anode stop 14, this electrical potential being referred to herein as anode stop potential $\varphi A$ (see FIG. 2). The resulting voltage between the anode stop potential $\varphi A$ and the extraction stop potential $\varphi Ext$ generates, between the extraction stop 13 and the anode stop 14, an electric field that is able, depending on the direction and strength, to accelerate or brake the particles of the particle beam 3, specifically each to different extents. Further details regarding the operation and the use of the anode stop 14 are described later on with reference to FIGS. 3A to 3C.

The particle source 11 and the extraction stop 13 are arranged in a first vacuum region V1 in which a first vacuum (ultra-high vacuum) is formed during operation. The first vacuum is established for example through a first housing section 15, a second housing section 16, the anode stop 14 and a pump, not illustrated, which evacuates the vacuum region V1. The first housing section 15 is designed for example as an electrical conductor, whereas the second housing section 16 is an electrical insulator.

The particle beam device 1 furthermore comprises a beam tube 23 that is arranged downstream of the anode stop 14. In the example shown in FIG. 1, the beam tube 23, viewed along the central axis 2 of the particle beam device 1, extends approximately from the anode stop 14 as far as into the inside of an objective lens 30. The beam tube 23 comprises a tubular body having a hollow interior 24, which has an entrance aperture 23' on the side of the anode stop 14 and an exit aperture 23" on the opposite side (see FIG. 2). During operation, the particle beam 3 coming from the anode stop 14 passes through the entrance aperture 23' into the interior 24 of the beam tube 23, passes through the interior 24 of the beam tube 23 and exits the beam tube 23 through the exit aperture 23".

An electrical potential may be applied to the beam tube 23, this electrical potential being referred to herein as beam tube potential $\varphi L$ (see FIG. 2). The resulting voltage between the anode stop potential $\varphi A$ and the beam tube potential $\varphi L$ generates, between the anode stop 14 and the beam tube 23, an electric field that is able, depending on the direction and strength, to accelerate or brake the particles of the particle beam 3, specifically each to different extents.

During operation, the particle beam device 1 has, in the beam tube 23, a second vacuum region V2 in which a second vacuum, different from the first vacuum in the first vacuum region V1, is formed. The entrance aperture 23' of the beam tube is located in the second vacuum region V2, which extends as far as the objective lens 30 in the example shown in FIG. 1. The second vacuum region V2 is established for example through the beam tube 23, the anode stop 14 and a pump, not illustrated, which evacuates the vacuum region V2. The anode stop 14 is located at an interface between the two vacuum regions V1 and V2 and serves as a pressure stage stop. The particle beam 3 passes through the interface of the two vacuum regions V1 and V2.

In FIG. 2, a distance D between the aperture 13' of the extraction stop 13 and the entrance aperture 23' of the beam tube 23 is indicated by a double-headed arrow. In FIG. 2, a distance E between the extraction stop 13 and the anode stop 14 is indicated by a double-headed arrow. The extraction stop 13 and the anode stop 14 use a relatively small installation space, meaning that the distance D may be between 5 mm and 20 mm. The distance D is for example at least 5 mm and/or at most 20 mm, such as at most 14 mm, for example at most 10 mm.

The particle beam device 1 furthermore comprises a multi-aperture stop 40 that is arranged in the hollow interior 24 of the beam tube 23. The multi-aperture stop 40 is therefore arranged downstream of the entrance aperture 23' of the beam tube 23 and upstream of the exit aperture 23" of the beam tube 23.

The multi-aperture stop 40 has a plurality of apertures 41, which have different sizes. The apertures 41 are spaced from one another such that the apertures do not overlap. The size of the apertures 41 is in the range of the diameter of the particle beam 3 in the plane (which is perpendicular to the central axis 2) in which the multi-aperture stop 40 is arranged. The multi-aperture stop 40 is therefore suitable for blocking part of the incident particle beam 3, as a result of which the current strength of the particle beam 3 is able to be limited. Depending on the size of the aperture 41, the current strength of the particle beam 3 may be limited to different extents. This means that the apertures 41 are designed such that the current strength of the particle beam 3 upstream of the multi-aperture stop 40 is greater than the current strength of the particle beam 3 immediately after passing through the multi-aperture stop 40.

The multi-aperture stop 40 may however also have one or more apertures whose size is large enough to leave the current strength of the particle beam 3 unchanged. When the particle beam 3 passes through such an aperture, the current strength of the particle beam 3 is effectively limited by another stop, for example by the anode stop 14. In this case, the current strength of the particle beam 3 is not reduced upon passing through the multi-aperture stop 40.

As illustrated in FIG. 1, the anode stop 14 and the multi-aperture stop 40 may be oriented (substantially) parallel to one another and each oriented perpendicular to the central axis 2.

The particle beam device 1 furthermore comprises a deflection system 43 that is configured to selectively deflect the particle beam 3, which has passed through the anode stop 14 and has entered the beam tube 23 through the entrance aperture 23', through one of the apertures 41 of the multi-aperture stop 40. In the example shown in FIG. 1, the deflection system 43 comprises three deflection units 44, 45 and 46. Each of the deflection units 44 to 46 is configured to deflect the particle beam 3 in the radial direction (that is to say perpendicular to the central axis 2). To deflect the particle beam 3 means to change the direction of the particle beam 3. In the example shown in FIG. 1, the deflection units 44 to 46 comprise coils. The deflection units 44 to 46 are controlled synchronously. The coils of the deflection units 44 to 46 are arranged outside the beam tube 23. Deflection units with an electrical action are also possible instead of magnetic deflection units in the form of coils.

The deflection unit 44 is configured to deflect the particle beam 3 between the entrance aperture 23' and the multi-aperture stop 40. The particle beam 3 may thereby be selectively directed onto (precisely) one of the apertures 41 of the multi-aperture stop 40. When the particle beam 3 is directed onto one of the apertures 41 of the multi-aperture stop 40 and in the process impinges partially on the multi-aperture stop 40 itself, the particle beam 3 is partially blocked by the multi-aperture stop 40, as a result of which the current strength of the particle beam 3 is changed. The current strength of the particle beam 3 may thus be set to different values as a function of the size of the apertures 41.

After passing through the multi-aperture stop 40, the particle beam 3 is deflected again by the other deflection units 45 and 46 and thereby directed onto the objective lens 30. The deflection units 45 and 46 are configured to deflect the particle beam 3 in the radial direction between the multi-aperture stop 40 and the objective lens 30.

The multi-aperture stop 40 and the deflection system 43 make it possible to be able to set the current strength of the particle beam 3 to different values. This creates a dynamic range for the current strength of the particle beam 3.

The particle beam device 1 furthermore comprises a condenser lens 51 that is configured to generate a magnetic field for focusing the particle beam 3 between the multi-aperture stop 40 and the objective lens 30. The condenser lens 51 comprises a magnetic core 52 for channelling the magnetic field and an excitation coil 53 for generating the magnetic field. The magnetic core 52 is designed to be substantially rotationally symmetrical about the central axis 2. The magnetic core 52 is for example of one-piece design. The magnetic core 52 is arranged completely outside the beam tube 23. The magnetic core 52 is arranged downstream of the anode stop 14 along the central axis 2. The magnetic core 52 is designed such that the magnetic field generated by the first condenser lens 51 acts primarily in the region of the active area of the deflection unit 45.

The condenser lens 51, by focusing the particle beam 3 downstream of the multi-aperture stop 40 and upstream of the objective lens 30, changes the divergence angle of the particle beam 3. The beam diameter of the particle beam 3 (measured perpendicular to the central axis 2) is thereby able to be varied. The beam diameter of the particle beam 3 may for example be adapted to the active area of the objective lens 30.

The particle beam device 1 furthermore comprises the objective lens 30, which is arranged downstream of the multi-aperture stop 40 and downstream of the active area of the condenser lens 51. The objective lens 30 is configured to focus the particle beam 3 onto a sample 4 that is positioned on a sample holder 5. For this purpose, the objective lens 30 comprises for example a magnetic core 31 and an excitation coil 32. The excitation coil 32 is configured to generate a magnetic field that is channelled by the magnetic core 31. The magnetic field leaves the magnetic core 31 in a gap 33 of the magnetic core 31 and is formed, when excited appropriately, such that the magnetic field has a focusing effect on the particle beam 3. In the example shown in FIG. 1, the gap 33, viewed along the central axis 2 of the particle beam device 1, is located approximately level with the exit aperture 23" of the beam tube 23.

A deflection system 35 is arranged along the central axis 2 level with the objective lens 30 and is configured to deflect the particle beam 3 in the radial direction (that is to say perpendicular to the central axis 2), in order thereby to direct the particle beam 3 onto different locations of the surface of the sample 4. The deflection system 35, in the example shown in FIG. 1, comprises two deflection units 36 and 37, which are formed from coils. In the example shown in FIG. 1, the coils of the deflection units 36 and 37 are arranged between the beam tube 23 and the magnetic core 31 of the objective lens 30. The two deflection units 36 and 37 are arranged in a manner distributed along the central axis 2.

The particle beam device 1 furthermore comprises a terminating stop 38 that is arranged downstream of the beam tube 23 and has an aperture 38' (see FIG. 2) through which the particle beam 3 passes during operation. An electrical potential may be applied to the terminating stop 38, this electrical potential being referred to herein as terminating stop potential $\varphi T$ (see FIG. 2). The terminating stop potential $\varphi T$ and the beam tube potential $\varphi L$ are generated such that the resulting voltage between the beam tube potential $\varphi L$ and the terminating stop potential $\varphi T$, that is to say the difference between the beam tube potential $\varphi L$ and the terminating stop potential $\varphi T$, generates an electric field, which acts on the particle beam 3, between the terminating stop 38 and the beam tube 23. The electric field (for example due to a geometry of the beam tube and of the terminating stop) acts for example substantially parallel to the central axis 2. The direction and the strength of the electric field is able to be set in a variable manner as a function of the voltage between the beam tube 23 and the terminating stop 38, this voltage being defined by the terminating stop potential $\varphi T$ and the beam tube potential $\varphi L$. This means that the strength of the electric field is able to be set to a large number of different values in a targeted manner through a control signal from the controller. By way of example, the voltage between the beam tube 23 and the terminating stop 38 is set such that the particles of the particle beam 3 are braked. This makes it possible to set the landing energy of the particles of the particle beam 3 on the sample 4.

In the example shown in FIG. 1, the terminating stop 38 is formed by the magnetic core 31. However, this is only an example. The terminating stop 38 may be separate and electrically isolated from the magnetic core 31.

The particle beam device 1 furthermore comprises the sample holder 5 on which the sample 4 is able to be positioned. An electrical potential may be applied to the sample holder 5 or the sample 4, this electrical potential being referred to herein as sample potential $\varphi S$ (see FIG. 2). The terminating stop potential $\varphi T$ and the sample potential $\varphi S$ are generated such that the resulting voltage between the terminating stop potential $\varphi T$ and the sample potential $\varphi S$ generates an electric field, which acts on the particle beam 3, between the terminating stop 38 and the sample 4. The electric field (for example due to a geometry of the terminating stop and of the sample/sample holder) acts for example substantially parallel to the central axis 2. The direction and the strength of the electric field is able to be set in a variable manner as a function of the voltage between the terminating stop 38 and the sample 4/the sample holder 5, this voltage being defined by the terminating stop potential $\varphi T$ and the sample potential $\varphi S$. This means that the strength of the electric field is able to be set to a large number of different values in a targeted manner through a control signal from the controller. By way of example, the voltage between the terminating stop 38 and the sample 4/the sample holder 5 is set such that the particles of the particle beam 3 are braked. This makes it possible to set the landing energy of the particles of the particle beam 3 on the sample 4.

The particle beam device 1 furthermore comprises a driver system 62. The driver system 62 is configured to generate the electrical potentials, voltages and currents used to operate the components of the particle beam device 1 and to supply them to the components. The driver system 62 can generate the particle source potential $\varphi HT$, the extraction stop potential $\varphi Ext$, the anode stop potential $\varphi A$, the beam tube potential $\varphi L$, the terminating stop potential $\varphi T$ and the sample potential $\varphi S$ and also the electric currents for operating the condenser lens 51 and the objective lens 30.

For this purpose, the driver system 62 may comprise one or more voltage and current sources that generate the electrical potentials, voltages and currents used to operate the components of the particle beam device 1. A line 63 represents all of the electrical lines that are used to supply the electrical potentials, voltages and currents from the driver system 62 to the individual components of the particle beam device 1. The line 63 is illustrated only schematically.

The particle beam device 1 furthermore comprises a controller 61 for controlling the driver system 62. The controller 61 may thereby set the individual electrical potentials, voltages and currents used to operate the components of the particle beam device 1 in a targeted manner and thus control the operation and action of the components of the particle beam device 1. Values of the individual electrical potentials, voltages and currents that are to be generated by the driver system 62 may be represented in the controller 61 by corresponding operating parameters. An operating parameter defines for example a value of an electrical potential, of a voltage or of an electric current.

The controller 61 may change the operation and effect of a component of the particle beam device 1 by changing the corresponding operating parameter. The operating parameters may be stored in a memory of the controller 61 and be changed by a processor of the controller 61. A set of operating parameters that is sufficient to operate the particle beam device 1 defines an operating mode of the particle beam device 1. Multiple sets of operating parameters that define multiple different operating modes may be stored in the memory of the controller 61. The controller 61 may accordingly operate the particle beam device 1 selectively in one of multiple operating modes. For this purpose, the controller 61 loads the operating parameters of the selected operating mode from the memory and instructs the driver system 62 to generate the electrical potentials, voltages and currents used to operate the components of the particle beam device 1 in accordance with the loaded operating parameters. A user may use a user interface (for example keyboard, mouse, etc.) to change the operating parameters of an operating mode. Various exemplary operating modes are described later on with reference to FIGS. 3A to 3C.

The particle beam device 1 is designed by way of example as a particle beam microscope in FIG. 1. For this purpose, the particle beam device 1 comprises detectors 6. The detectors 6 are designed in the manner of a stop having an aperture and arranged inside the beam tube 23 upstream of the objective lens 30. The particle beam 3 coming from the particle source 11 passes through the apertures in the detectors 6 and is focused on the sample 4 by the objective lens 30. Particles are emitted by the sample 4 as a result of the interaction between the particle beam 3 and the sample 4. The particles emitted by the sample 4 may be for example backscattered electrons or secondary electrons. When the particle beam device 1 is an ion beam column, the particles emitted by the sample 4 may also be backscattered ions or secondary ions. Radiation (for example light in the form of fluorescence, cathodoluminescence, etc. or X-ray radiation) may also be emitted and detected as a result of the interaction between the particle beam 3 and the sample 4. In the example of FIG. 1, charged particles emitted by the sample 4 enter the beam tube 23 through the objective lens 30 and are detected by one of the detectors 6 depending on the trajectory. Other types of detectors may be used.

A description is given below, with reference to FIGS. 3A to 3C, of the operation of the anode stop 14 for different operating modes. Of the components of the particle beam system 1, FIG. 3A shows only the particle source 11, the suppression electrode 12, the extraction stop 13 and the anode stop 14 and the electrical potentials applied to each of them.

Figure 3A:
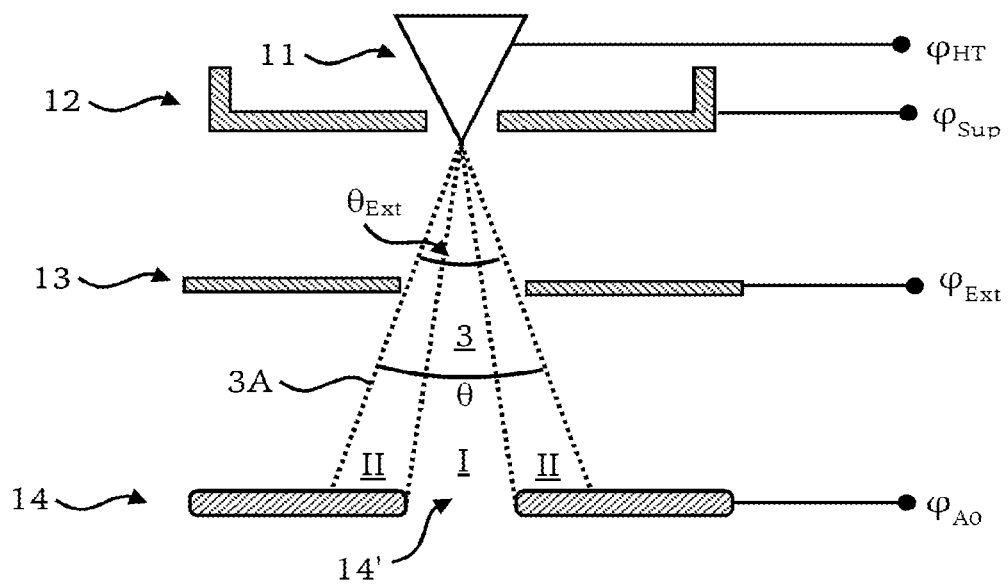
FIG. 3A shows a schematic illustration of a part of the particle beam device in a first operating mode.

In the operating mode shown in FIG. 3A, the particle source potential $\varphi HT$ and the extraction stop potential $\varphi Ext$ are generated such that charged particles are extracted from the particle source 11 as a result of the voltage between the particle source potential $\varphi HT$ and the extraction stop potential $\varphi Ext$. A divergence angle $\theta Ext$ denotes a maximum angle between trajectories of charged particles that come from (the same point, for example a peak of) the particle source 11 and are able to pass through the extraction stop 13, through the aperture 13' of the extraction stop 13.

In the operating mode shown in FIG. 3A, the divergence angle $\theta$ of the particle beam 3 does not change downstream of the extraction stop 13. This means that the anode stop potential $\varphi A0$ and the extraction stop potential $\varphi Ext$ are the same and therefore no electric field acting on the particle beam 3 is generated between the extraction stop 13 and the anode stop 14. The trajectories of the particles of the particle beam 3 therefore run from the particle source 11 to the anode stop 14 in a straight line, as shown by the exemplary trajectories 3A.

By way of example, the electrical potentials $\varphi HT$, $\varphi Ext$, $\varphi A0$, $\varphi L$ and $\varphi T$ in this operating mode have the following values:

$\varphi HT=-1$ kV; $\varphi Ext=\varphi HT+3$ kV=+2 kV; $\varphi A0=\varphi Ext$;
$\varphi L=+8$ kV; and $\varphi T=0$ kV.

As shown in FIG. 3A, a portion II of the particles of the particle beam 3 that has passed through the extraction stop 13 impinges on the anode stop 14. The anode stop 14 blocks the portion II of the particles of the particle beam 3. Only a portion I of the particles of the particle beam 3 that is directed onto the aperture 14' of the anode stop 14 passes through the anode stop 14. This changes the current strength of the particle beam 3 on the anode stop 14. More precisely, the current strength of the particle beam 3 on the anode stop 14 is reduced.

Figure 3B:
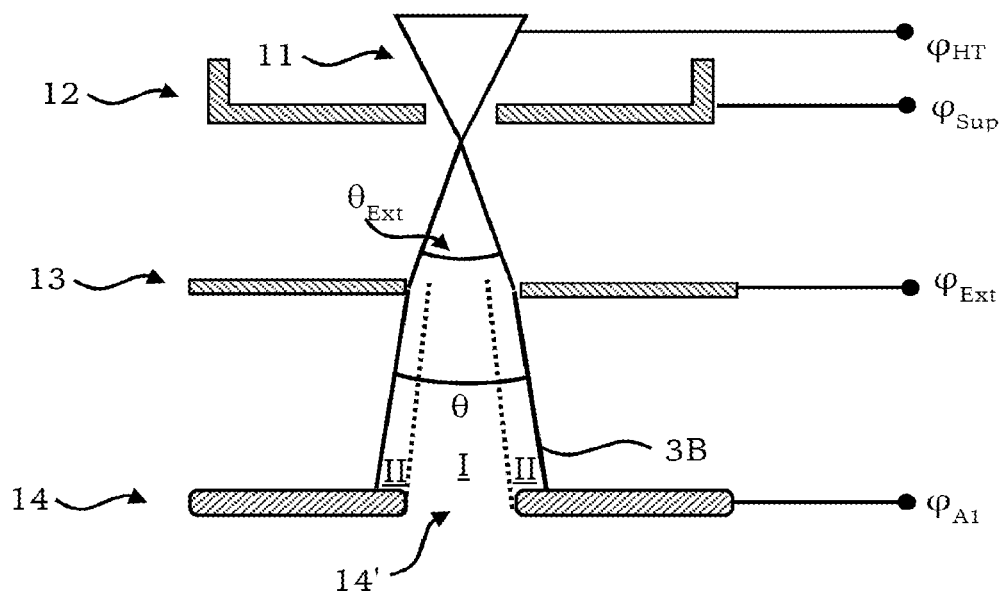
FIG. 3B shows a schematic illustration of the part of the particle beam device in a second operating mode.

In the operating mode shown in FIG. 3B, the particle source potential $\varphi HT$ and the extraction stop potential $\varphi Ext$ are generated as in FIG. 3A. However, the anode stop potential $\varphi A1$, in comparison with the example of FIG. 3A, has been changed such that an electric field, which has an accelerating effect on the particle beam 3, is generated between the extraction stop 13 and the anode stop 14.

By way of example, the electrical potentials $\varphi HT$, $\varphi Ext$, $\varphi A1$, $\varphi L$ and $\varphi T$ in this operating mode have the following values:

$\varphi HT=-1$ kV; $\varphi Ext=\varphi HT+3$ kV=+2 kV; $\varphi A1>\varphi Ext$
(e.g. $\varphi A1=+10$ kV); $\varphi L=+8$ kV; and $\varphi T=0$ kV.

In the present example, the particles of the particle beam 3 are accelerated, as a result of which the divergence angle $\theta$ of the particle beam 3 between the extraction stop 13 and the anode stop 14 is reduced in comparison with the example shown in FIG. 3A. The local current strength of the particle beam in the aperture 14' of the anode stop 14 is thus also changed. More precisely, the local current strength of the particle beam 3 in the aperture 14' of the anode stop 14 is increased in comparison with the example shown in FIG. 3A. The current strength of the particle beam 3 that passes through the anode stop 14, through the aperture 14' of the anode stop 14, is thus changed.

In other words, as a result of the reduced divergence angle $\theta$ of the particle beam 3, the portion II of the particles of the particle beam 3 that has passed through the extraction stop 13 but is blocked by the anode stop 14 is reduced, and the portion I of the particles of the particle beam 3 that passes through the extraction stop 13 and the anode stop 14 is increased. As a result of the changed anode stop potential $\varphi A1$, the ratio of particles of the particle beam 3 (portion I) that pass through the aperture 14' of the anode stop 14 to particles of the particle beam 3 (portion II) that are blocked by the anode stop 14 has thus been increased.

Figure 3C:
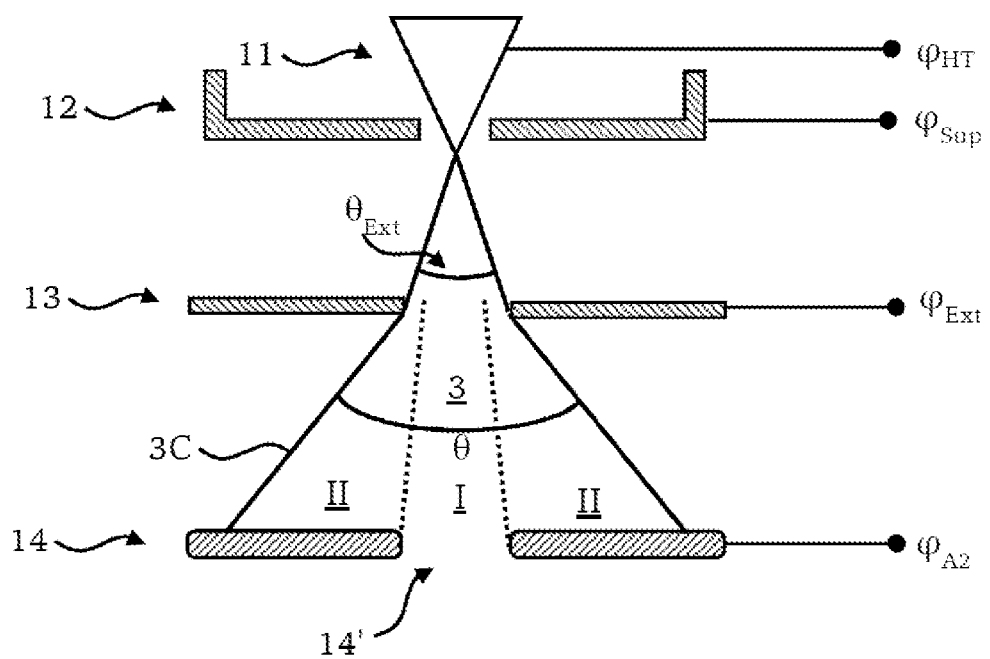
FIG. 3C shows a schematic illustration of the part of the particle beam device in a third operating mode.

In the operating mode shown in FIG. 3C, the particle source potential $\varphi HT$ and the extraction stop potential $\varphi Ext$ are generated as in FIGS. 3A and 3B. However, the anode stop potential $\varphi A2$, in comparison with the examples of FIGS. 3A and 3B, has been changed such that an electric field, which has a braking effect on the particle beam 3, is generated between the extraction stop 13 and the anode stop 14.

By way of example, the electrical potentials $\varphi HT$, $\varphi Ext$, $\varphi A2$, $\varphi L$ and $\varphi T$ in this operating mode have the following values:

$\varphi HT=-1$ kV; $\varphi Ext=\varphi HT+3$ kV=+2 kV; $\varphi A2<\varphi Ext$
(e.g. $\varphi A2=0$ kV); $\varphi L=+8$ kV; and $\varphi T=0$ kV.

In the present example, the particles of the particle beam 3 are braked, as a result of which the divergence angle $\theta$ of the particle beam 3 between the extraction stop 13 and the anode stop 14 is increased in comparison with the example shown in FIG. 3A. The local current strength of the particle beam in the aperture 14' of the anode stop 14 is thus also changed. More precisely, the local current strength of the particle beam 3 in the aperture 14' of the anode stop 14 is reduced in comparison with the example shown in FIG. 3A. The current strength of the particle beam 3 that passes through the anode stop 14, through the aperture 14' of the anode stop 14, is thus changed.

In other words, as a result of the increased divergence angle θ of the particle beam 3, the portion II of the particles of the particle beam 3 that has passed through the extraction stop 13 but is blocked by the anode stop 14 is increased, and the portion I of the particles of the particle beam that passes through the extraction stop 13 and the anode stop 14 is reduced. As a result of the changed anode stop potential φA2, the ratio of particles of the particle beam 3 (portion I) that pass through the aperture 14' of the anode stop 14 to particles of the particle beam 3 (portion II) that are blocked by the anode stop 14 has thus been reduced.

The electric field, which is able to be set in a variable manner through the extraction stop potential φExt and the anode stop potential φA, thus achieves a dynamic range for the current strength of the particle beam 3. The current strength of the particle beam 3 that passes through the anode stop 14 through the aperture 14' may thus be set to a large number of different values other than zero.

What is claimed is:

1. A particle beam device, comprising:
   a particle source configured to provide charged particles;
   an extraction stop comprising an aperture;
   a driver system configured to apply an electrical extraction stop potential to the extraction stop to generate, from the charged particles, a particle beam that passes through the aperture of the extraction stop;
   an anode stop downstream of the extraction stop and comprising an aperture onto which the particle beam is directed during operation of the particle beam device, the driver system further configured to apply a variably settable electrical anode stop potential to the anode stop, the anode stop potential being different from the extraction stop potential;
   a beam tube downstream of the anode stop and comprising an entrance aperture through which the particle beam enters the beam tube during operation of the particle beam device, the driver system further configured to apply an electrical beam tube potential different from the anode stop potential, to the beam tube;
   a controller configured to control the driver system so that a voltage between the extraction stop and the anode stop is variably settable,
   wherein the aperture of the extraction stop and the aperture of the anode stop are matched to one another such that a current strength of the particle beam passing through the aperture of the anode stop is variably settable by changing the voltage between the extraction stop and the anode stop during operation of the particle beam device.

2. The particle beam device of claim 1, wherein the aperture of the extraction stop and the aperture of the anode stop are matched so a ratio of particles of the particle beam that pass through the aperture of the anode stop to particles of the particle beam that are blocked by the anode stop is variably settable by changing the voltage between the extraction stop and the anode stop during operation of the particle beam device.

3. The particle beam device of claim 1, wherein the controller is configured, by controlling the driver system during operation of the particle beam device, to set the voltage between the extraction stop and the anode stop so that the particles of the particle beam are accelerated between the extraction stop and the anode stop.

4. The particle beam device of claim 1, wherein the controller is configured to control the driver system so that an absolute value of the voltage between the extraction stop and the anode stop is at least 1 kV.

5. The particle beam device of claim 1, wherein the driver system is further configured to variably set the beam tube potential.

6. The particle beam device of claim 1, wherein the controller is configured, by controlling the driver system during operation of the particle beam device, to generate the anode stop potential and the beam tube potential so that the particles of the particle beam are braked between the anode stop and the beam tube.

7. The particle beam device of claim 1, wherein the controller is configured, by controlling the driver system during operation of the particle beam device, to generate the anode stop potential and the beam tube potential so that the particles of the particle beam are accelerated between the anode stop and the beam tube.

8. The particle beam device of claim 1, wherein the controller is configured to control the driver system so that the absolute value of a voltage between the anode stop and the beam tube is at least 1 kV.

9. The particle beam device of claim 1, wherein the aperture of the extraction stop and the entrance aperture of the beam tube are at at least 5 mm and/or at most 20 mm from each other.

10. The particle beam device of claim 1, wherein:
    the extraction stop potential is settable in a range from (φHT+0.5 kV) to (φHT+7 kV) by the controller;
    φHT is an electrical particle source potential applied to the particle source;
    the anode stop potential is settable in a range from −15 kV to +15 kV by the controller; and
    the beam tube potential is settable in a range from 0 kV to 10 kV by the controller.

11. The particle beam device of claim 10, wherein:
    the driver system is further configured to apply the electrical particle source potential (φHT) to the particle source; and
    the electrical particle source potential (φHT) is settable in a range from −30 kV to −100 V by the controller.

12. The particle beam device of claim 10, wherein the controller is further configured to change the voltage between the extraction stop and the anode stop to keep a voltage between the extraction stop potential and the particle electrical source potential (φHT) substantially constant.

13. The particle beam device of claim 10, further comprising a sample holder on which a sample is positionable, wherein:
    the driver system is further configured to apply an electrical sample potential to the sample or the sample holder; and
    the controller is further configured to change the voltage between the extraction stop and the anode stop to keep a voltage between the sample potential and the particle source potential constant.

14. The particle beam device of claim 13, wherein the sample potential is settable between −1 kV and +1 kV.

15. The particle beam device of claim 1, further comprising a terminating stop downstream of the beam tube, wherein:
the terminating stop comprises an aperture through which the particle beam passes during operation of the particle beam device;
the driver system is further configured to apply an electrical terminating stop potential to the terminating stop; and
the driver system is configured to generate the beam tube potential and the terminating stop potential so that a voltage between the beam tube and the terminating stop settable to different values as a function of a signal from the controller.

16. The particle beam device of claim 15, wherein the controller is configured, by controlling the driver system during operation of the particle beam device, to generate the beam tube potential and the terminating stop potential so the particles of the particle beam are braked between the beam tube and the terminating stop.

17. The particle beam device of claim 15, wherein the terminating stop potential is settable between −1 kV and +1 kV.

18. The particle beam device of claim 1, further comprising a multi-aperture stop and a deflection system, wherein the multi-aperture stop is in the beam tube downstream of the entrance aperture, the multi-aperture stop comprises a plurality of adjacent differently sized apertures, and the deflection system is configured to selectively deflect the particle beam onto one of the apertures of the multi-aperture stop.

19. The particle beam device of claim 18, wherein the multi-aperture stop is a pressure stage stop by way of which a vacuum region located upstream of the multi-aperture stop and a vacuum region downstream of the multi-aperture stop are separated from one another.

20. The particle beam device of claim 1, wherein:
the particle beam device has a first vacuum region in which the particle source and the extraction stop are disposed;
the particle beam device has a second vacuum region in which the entrance aperture of the beam tube is disposed; and
during operation of the particle beam device, the first vacuum region and the second vacuum region maintain different vacuums.

21. The particle beam device of claim 20, wherein the anode stop is at an interface between the first and second vacuum regions.

22. The particle beam device of claim 1, further comprising an objective lens downstream of the entrance aperture of the beam tube, wherein the objective lens is configured to focus the particle beam.

23. A method, comprising:
providing the particle beam device of claim 1; and
changing the voltage between the extraction stop and the anode stop in a controlled manner to change a current strength of the particle beam passing through the aperture of the anode stop.

24. One or more machine-readable hardware storage devices comprising instructions that are executable by one or more processing devices to perform operations comprising the method of claim 23.

* * * * *

UNITED STATES PATENT AND TRADEMARK OFFICE
CERTIFICATE OF CORRECTION

Page 1 of 1

PATENT NO. : 12,300,461 B2
APPLICATION NO. : 17/822530
DATED : May 13, 2025
INVENTOR(S) : Bjoern Gamm and Erik Essers It is certified that error appears in the above-identified patent and that said Letters Patent is hereby corrected as shown below:

In the Specification

Column 5, Line 57, delete "yExt" and insert -- φExt --.

Column 5, Line 58, delete "φHT+0.5 kV) to φHT+7 kV)." and insert -- (φHT+0.5 kV) to (φHT+7 kV). --.

Column 5, Line 60, delete "–kV" and insert -- –15 kV --.

Column 6, Line 21, delete "φExt+1 kV) to φExt+10 kV)," and insert -- (φExt+1 kV) to (φExt+10 kV), --.

Column 6, Lines 21-22, delete "φExt–3 kV) to φExt+15 kV)." and insert -- (φExt–3 kV) to (φExt+15 kV). --.

Signed and Sealed this
Twenty-fourth Day of June, 2025

Coke Morgan Stewart
*Acting Director of the United States Patent and Trademark Office*